United States Patent [19]

Kawakami

[11] Patent Number: 5,393,991
[45] Date of Patent: Feb. 28, 1995

[54] HYBRID INTEGRATED CIRCUIT DEVICE HAVING BURN-IN TESTING MEANS

[75] Inventor: Takayoshi Kawakami, Itami, Japan

[73] Assignee: Mitsubishi Denki Kubushiki Kaisha, Tokyo, Japan

[21] Appl. No.: 135,556

[22] Filed: Oct. 14, 1993

[30] Foreign Application Priority Data

Oct. 14, 1992 [JP] Japan .................. 4-276269

[51] Int. Cl.⁶ .................. H01L 21/66; H01L 23/16; H01L 39/02; H01L 29/78
[52] U.S. Cl. .................. 257/48; 257/401; 257/723; 257/786
[58] Field of Search .................. 257/48, 228, 288, 293, 257/337, 401, 786

[56] References Cited

U.S. PATENT DOCUMENTS 5,036,380 1/1991 Chase .................. 257/48

FOREIGN PATENT DOCUMENTS 4-152651 5/1992 Japan .................. 257/48
4-199864 7/1992 Japan .................. 257/48

OTHER PUBLICATIONS

Goodman et al. 1 IBM Technical Disclosure Bulletin, "Pad Deletion Test Technique", vol. 26, No. 10A, Mar. 1984, pp. 4889-4890. 1

IBM Tehnical Disclosure Bulletin, vol. 36, No. 08, Aug. 1993, pp. 223-224.

*Primary Examiner*—Manshid D. Saadat
*Attorney, Agent, or Firm*—Leydig, Voit & Mayer

[57] ABSTRACT

A highly reliable hybrid integrated circuit device includes at least one bare chip power MOS-FET and a control IC for controlling the power MOS-FET, both mounted on a circuit substrate. A burn-in test voltage supply line supplies a burn-in test voltage to a gate terminal of the power MOS-FET for a burn-in test. Where a plurality of MOS-FETs are present, burn-in test voltage supply lines connect the gate terminals of the power MOS-FETs to each other. The supply lines are severed to electrically separate the gate terminals from each other after the burn-in test is completed. Alternatively, resistors having a predetermined resistance are inserted in the supply lines so that normal operation, after the burn-in test, is not affected by the gate connections.

3 Claims, 3 Drawing Sheets

HYBRID INTEGRATED CIRCUIT DEVICE HAVING BURN-IN TESTING MEANS

BACKGROUND OF THE INVENTION

1. Field of the Invention

The present invention relates to a hybrid integrated circuit device in which a power metal oxide semiconductor field effect transistor (MOS-FET) is mounted in a bare chip state.

2. Description of the Related Art

FIG. 4 is an exploded perspective view showing an example of a power control unit mounted on, for example, a vehicle and accommodating the above-described type of hybrid integrated circuit device in a package thereof. In the hybrid integrated circuit device, power MOS-FETs 2 used for controlling power, control ICs 1 and so on are mounted on a circuit substrate 3 with a circuit pattern 3a printed on the surface thereof. The power MOS-FETs 2 are mounted in a bare chip state. External connection terminals 10 through 15 extend from the circuit substrate 3 for electrical connection with an external device. The circuit substrate 3 with the components mounted thereon is accommodated in a package body 100a of a package 100. The package has a lid 100b. The external connection terminals 10 through 15 are exposed from the package 100.

FIG. 5 schematically illustrates the configuration of a conventional hybrid integrated circuit device. In the figure, reference numeral 1 denotes a control IC. Reference numeral 2 denotes a power MOS-FET. Reference numeral 3 denotes a circuit substrate. Reference numeral 4 denotes a control voltage supply line which is part of the circuit pattern 3a shown in FIG. 4. Reference symbol R1 is a resistor inserted in the control voltage supply line 4 between the control IC 1 and a gate terminal of the power MOS-FET 2. Reference numeral R2 denotes a resistor connected between the gate terminal of the power MOS-FET 2 and a source terminal thereof. Reference numerals 10 through 15 denote external connection terminals extending from the circuit substrate 3.

The operation of the conventional hybrid integrated circuit device will be described below. The control IC 1 applies a control voltage to the gate terminal of the power MOS-FET 2 via the control voltage supply line 4 according to the control signal input from the external connection terminals 12 and 13. Current flow between the drain and source of the power MOS-FET 2 is turned on and off by that control voltage applied to the gate terminal. The control voltage applied between the gate and source of the power MOS-FET 2 at that time is about 10 volts for general transistors. About 5 volts are applied in the case of low-voltage driven transistors. Alternatively, a voltage waveform signal whose pulse width is controlled is applied.

When the power MOS-FET is mounted in a bare chip state in the hybrid integrated circuit device arranged in the manner described above, the damage during the manufacturing process of the hybrid integrated circuit device, the stress due to an external stress or latent defects caused by the manufacturing process or the structure of a power MOS-FET device must be eliminated initially, and a burn-in screening test is, then, conducted on the power MOS-FET. This burn-in screening test may be conducted before the assembly on preliminary processed products. Alternatively, the test may be conducted during the assembly of the device or after the assembly thereof by simulating a normal operation (a burn-in test which uses a normal voltage). However, it is difficult to actually perform the burn-in test because connection of the terminals is not yet completed at the processing stage of the device or because the circuit connection must be temporarily disconnected by any means so that a burn-in test voltage can be directly applied to the gate terminal of the power MOS-FET. In an effective burn-in test which can be conducted in a short period of time, a voltage higher than that normally applied to the gate terminal of the power MOS-FET is applied. However, in the conventional hybrid integrated circuit device, this adversely affects other components and cannot be used.

SUMMARY OF THE INVENTION

Accordingly, an object of the present invention is to provide a hybrid integrated circuit device which enables a burn-in procedure to be conducted on a power MOS-FET effectively and efficiently, and which is thus inexpensive and highly reliable.

According to one aspect of the present invention, there is provided a hybrid integrated circuit device in which at least a single power MOS-FET in a bare-chip state and a control IC for controlling the power MOS-FET are mounted on a circuit substrate. The hybrid integrated circuit device comprises a burn-in test means for supplying a burn-in test voltage to a gate terminal of the power MOS-FET independently of the control IC. The burn-in test means includes a burn-in test voltage supply-line connected to the gate terminal, an external connection terminal for a burn-in test connected to the burn-in test voltage supply line, and a diode provided in a control voltage supply line which connects the control IC to the gate terminal of the power MOS-FET for preventing reverse flow of a current to the control IC. The diode is provided when necessary.

According to another aspect of the present invention, there is provided a hybrid integrated circuit device in which a plurality of power MOS-FETs, each in a bare chip state, and a control IC for controlling the power MOS-FETs are mounted on a circuit substrate. The hybrid integrated circuit device comprises a burn-in test means connected to a gate terminal of each of the power MOS-FETs for supplying a burn-in test voltage to the gate terminal independently of the control IC, and an electrically disconnecting portion provided in a burn-in test voltage supply line of the burn-in test means, the electrically disconnecting portion being electrically opened to electrically separate the gate terminals of the power MOS-FETs from each other after the burn-in test is completed. The burn-in test means includes burn-in test voltage supply lines each of which is connected directly or via a resistor to each of the gate terminals, and an external connection terminal for the burn-in test connected to all of the burn-in voltage supply lines, and diodes, each of which is provided in one of the control voltage supply lines which connect the control IC to the gate terminals of the power MOS-FETs to prevent reverse flow of a current to the control IC. The diodes are provided when necessary. The electrically disconnecting portion is provided in a branched line of each of the burn-in test voltage supply lines which is connected to each of the gate terminals.

According to still another aspect of the present invention, there is provided a hybrid integrated circuit device in which a plurality of power MOS-FETs in a bare chip state, and a control IC for controlling the power MOS-FETs are mounted on a circuit substrate. The hybrid integrated circuit device comprises a burn-in test means connected to the gate terminal of each of the power MOS-FETs via respective resistor having a predetermined resistance which assures prevention of trouble during normal operation, after testing, in supplying a burn-in test voltage to the gate terminals independently of the control IC. The burn-in test means includes burn-in test voltage supply lines, each of which is connected to the gate terminal of one of the power MOS-FETs via the resistor having the predetermined resistance which assures prevention of trouble in normal operation, an external connection terminal for a burn-in test being connected to all of the burn-in test voltage supply lines, and diodes, each of which is provided in one of the control voltage supply lines which connect the control IC to the gate terminals of the power MOS-FETs for preventing reverse flow of a current to the control IC. The diodes are provided when necessary.

In the hybrid integrated circuit device according to one aspect of the present invention, a burn-in test voltage can be supplied effectively to the gate terminal of the power MOS-FET independently of the control voltage from the control IC by applying a desired burn-in test voltage to the external connection terminal for the burn-in test. The reverse flow of a current to the control IC, which would occur at that time, can be prevented by the diode inserted in the control voltage supply line.

In the hybrid integrated circuit device according to another aspect of the present invention, a burn-in test voltage can be supplied effectively to the gate terminal of each of the plurality of power MOS-FETs independently of the control voltage from the control IC by applying a desired burn-in test voltage to the external connection terminal for the burn-in test. Further, the gate terminals of the power MOS-FETs are electrically separated from each other after the burn-in test is completed by opening the electrically disconnecting portions provided in the burn-in test voltage supply lines. Thereafter, normal operation can be obtained.

In the hybrid integrated circuit device according to still another aspect of the present invention, a burn-in test voltage can be supplied effectively to the gate terminal of each of the plurality of power MOS-FETs independently of the control voltage from the control IC by applying a desired burn-in test voltage to the external connection terminal for the burn-in test in the same manner as that of the device according to another aspect of the present invention. Further, since a resistor having the predetermined resistance is inserted in each of the burn-in test voltage supply lines in order to prevent problem in normal operation, cutting of the supply lines after the burn-in test is not necessary.

DETAILED DESCRIPTION OF THE PREFERRED EMBODIMENTS

Embodiments of the present invention will be described with reference to the accompanying drawings.

First Embodiment

Figure 1:
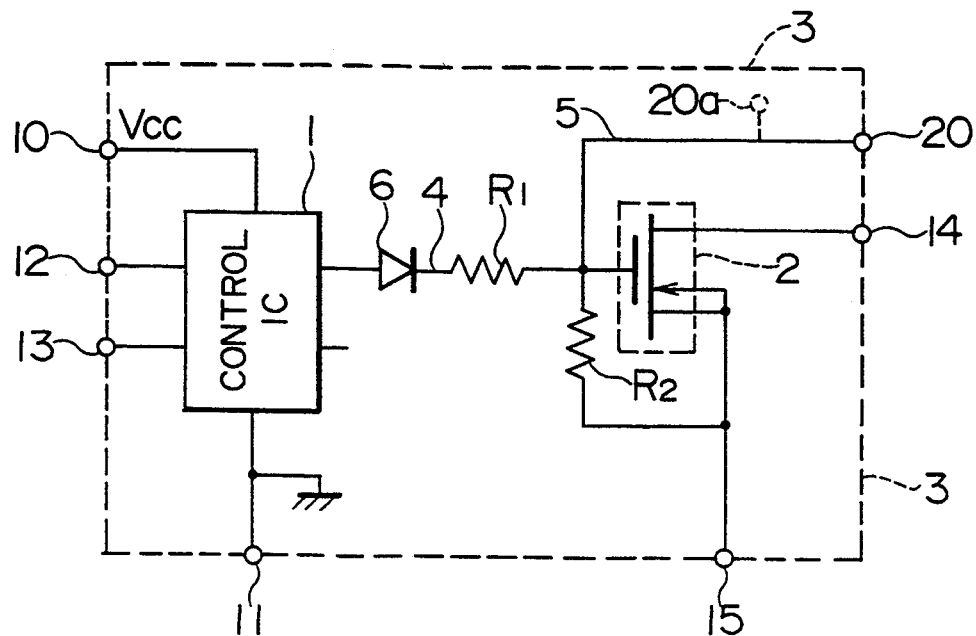
FIG. 1 is a circuit diagram schematically showing a first embodiment a hybrid integrated circuit device according to the present invention.
Figure 4:
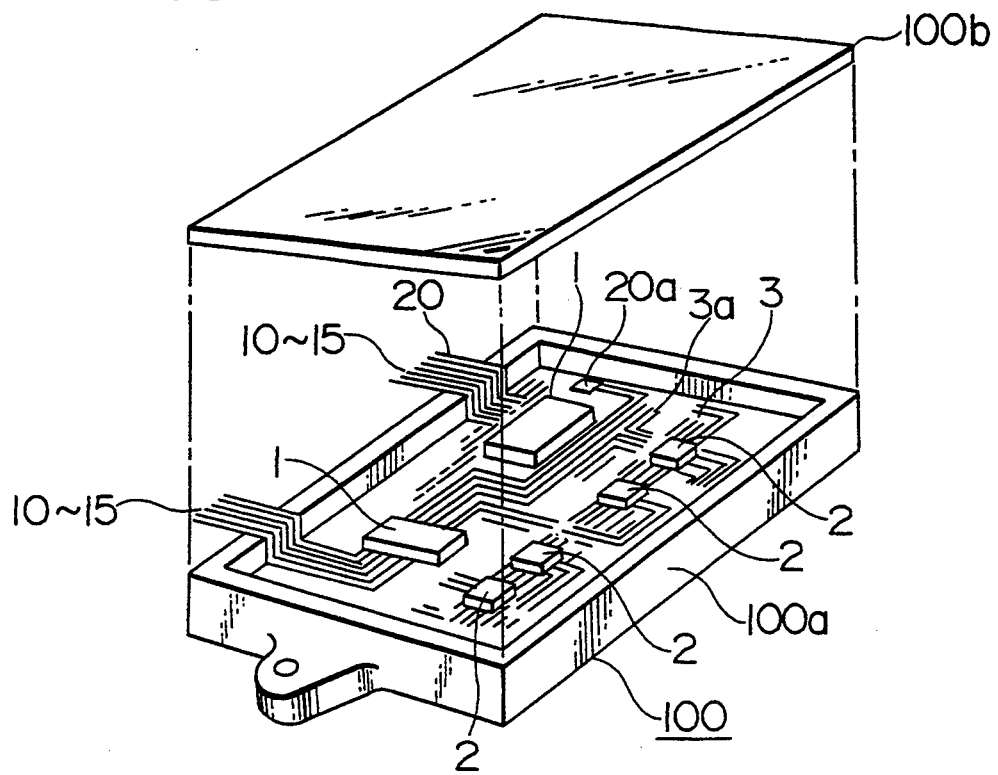
FIG. 4 is an exploded perspective view of a power control unit in which the hybrid integrated circuit device of the type shown in FIG. 1, 2 or 3 is incorporated.
Figure 5:
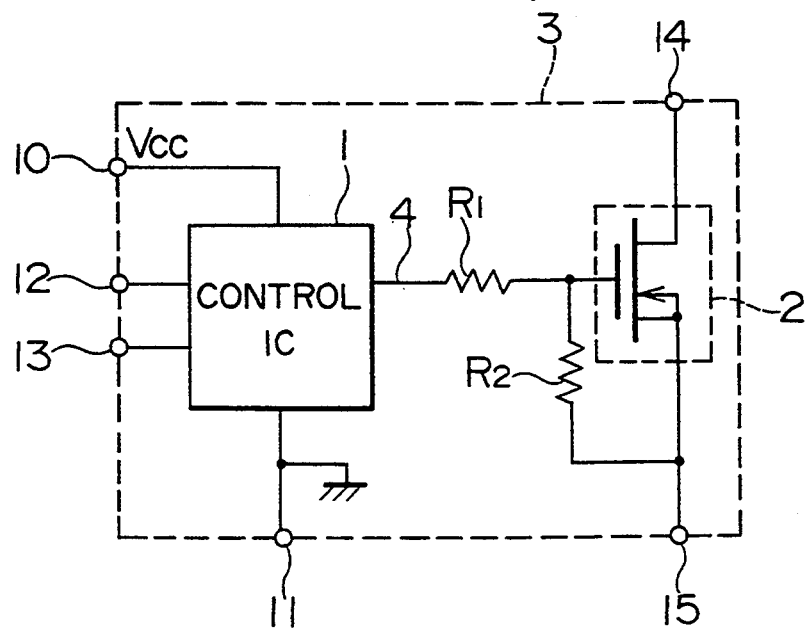
FIG. 5 is a circuit diagram schematically showing a conventional hybrid integrated circuit device.

FIG. 1 is a schematic view of an embodiment of a hybrid integrated circuit device according to the present invention. In FIG. 1, reference numeral 1 denotes a control IC. Reference numeral 2 denotes a power MOS-FET. Reference numeral 3 denotes a circuit substrate. Reference numeral 4 denotes a control voltage supply line. Reference numerals 10 through 15 denote external connection terminals. The external connection terminal 10 is a terminal for connecting the control IC 1 to a power source. The external connection terminal 11 is a grounding terminal for the control IC 1. The external connection terminals 12 and 13 are terminals for supplying a control signal to the control IC 1, and external connection terminals 14 and 15 are terminals connected to a drain terminal and a source terminal of the power MOS-FET 2, respectively. Reference numeral 5 denotes a burn-in test voltage supply line for supplying a burn-in test voltage to the gate terminal of the power MOS-FET 2. Reference numeral 20 denotes an external connection terminal for the burn-in test to which a burn-in test voltage is applied from an external circuit. Reference numeral 6 denotes a diode for preventing reverse flow of a current to the control IC 1. A resistor R1 is inserted in the control voltage supply line. A resistor R2 is connected between the gate and source terminals of the power MOS-FET 2. This hybrid integrated circuit device is accommodated in a package in the same manner as that shown in FIG. 4.

The operation of the hybrid integrated circuit device shown in FIG. 1 will be described below. During normal operation, the control IC 1 generates a control voltage according to a control signal from the external connection terminals 12 and 13. This control voltage is applied to the gate terminal of the power MOS-FET 2 through the diode 6 and the resistor R1 in the control voltage supply line 4. The gate voltage required to turn on the power MOS-FET 2 is about 5 or 10 volts relative to the source potential. This voltage is set to a value which assures sufficient on resistance performance between the drain and the source of the MOS-FET 2.

To perform the burn-in test, control signals are applied to the external connection terminals 12 and 13 such that they turn off the MOS-FET 2. Thereafter, a burn-in test voltage is applied from the external connection terminal 20 for the burn-in test to the gate terminal of the MOS-FET 2 via the supply line 5 under conditions of preset voltage and time. The burn-in test voltage value may be 25 volts relative to the source potential of the MOS-FET 2. At that time, the diode 6 prevents breakage of the circuit components (not shown) of the output stage of the control IC 1. Further, the resistors R1 and R2 and the control IC 1 are set such that the switching (turning on and off) speed of the normally operating MOS-FET 2 does not slow down extremely. The burn-in test includes a test conducted at a normal voltage and a test conducted at a voltage higher than the normal voltage (rated voltage).

In the embodiment shown in FIG. 1, the diode 6 and the resistor R1 are inserted in the control voltage supply line 4. However, they may be provided as components of the control IC 1. Further, the provision of the diode 6 is not necessary when the components of the output stage of the control IC 1 for supplying the control voltage to the gate terminal can withstand the burn-in test voltage. Further, an internal connection terminal 20a for the burn-in test (indicated by the broken line) may be provided on the circuit substrate 2 in place of the external connection terminal 20 for the burn-in test. The external connection terminal 20 for the burn-in test and the internal connection terminal 20a for the burn-in test are provided in the manner shown in, for example, FIG. 4. In the case where a plurality of power MOS-FETs 2 are provided, a burn-in test voltage supply line 5 and an external connection terminal 20 are provided for each of the power MOS-FETs.

Second Embodiment

Figure 2:
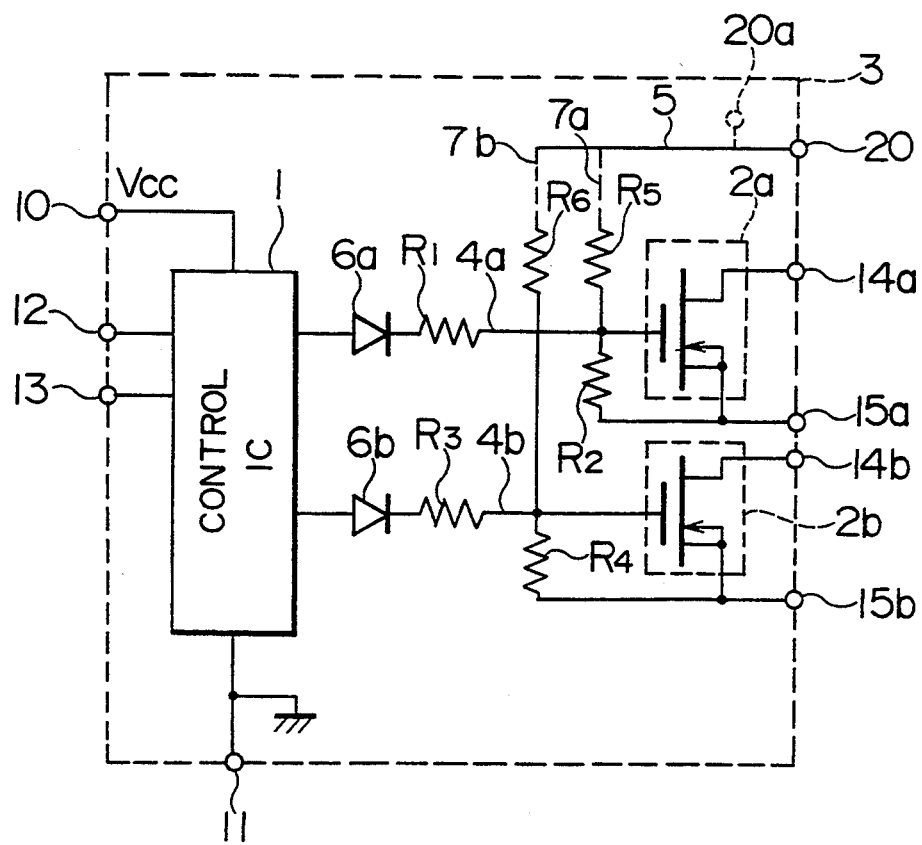
FIG. 2 a circuit diagram schematically showing a second embodiment of a the hybrid integrated circuit device according to the present invention.

FIG. 2 schematically shows a second embodiment of the hybrid integrated circuit device according to the present invention. This embodiment includes a plurality of power MOS-FETs. The control IC 1 controls a plurality, of power MOS-FETs 2a and 2b. Reference numerals 4a and 4b denote control voltage supply lines. Reference numerals 6a and 6b denote diodes. Reference numerals 7a and 7b denote electrical disconnecting portions provided in branched lines of the burn-in test voltage supply line 6 which are connected to the gate terminals of the MOS-FETs 2a and 2b, respectively. Reference numerals 10 through 13, 14a, 14b, 15a and 15b denote external connection terminals. Reference numerals R1 through R6 denote resistors.

More specifically, a typical example of the circuit device for controlling the plurality of MOS-FETs, shown in FIG. 2, includes two MOS-FETs 2a and 2b. In the MOS-FET 2a, the drain terminal and the source terminal thereof are respectively connected to the external connection terminals 14a and 15a, and the gate terminal thereof is connected to the control IC 1 via the control voltage supply line 4a. The diode 6a and the resistor R1 are inserted in the control voltage supply line 4a. The resistor R2 is connected between the gate terminal and the source terminal of the MOS-FET 2a. The gate terminal is also connected to the burn-in test voltage supply line 5, which is in turn connected to the external connection terminal 20 for the burn-in test. The resistor R5 and the electrically disconnecting portion 7a are provided in the test voltage supply line 5. Similarly, the drain terminal and the source terminal of the MOS-FET 2b are respectively connected to the external connection terminals 14b and 15b, and the gate terminal thereof is connected to the control IC 1 via the control voltage supply line 4b. The diode 6b and the resistor R3 are inserted in the control voltage supply line 4b. The resistor R4 is connected between the gate terminal and the source terminal of the MOS-FET 2b. The gate terminal of the MOS-FET 2b is also connected to the burn-in test voltage supply line 5, which is in turn connected to the external connection terminal 20 for the burn-in test. The resistor R6 and the electrically disconnecting portion 7b are provided in the test voltage supply line 5.

The operation of the hybrid integrated circuit device shown in FIG. 2 will be described below. The resistors 5 and 6 are inserted in the burn-in test voltage supply line 5, which is connected from the gate terminals of the MOS-FETs 2a and 2b to the external connection terminal 20 for the burn-in test, separate from normally employed circuits. When the burn-in test is conducted in the intermediate or final stage of the assembly, control signals are applied to the external connection terminals 12 and 13 such that they turn off the MOS-FETs 2a and 2b, and then a burn-in test voltage is applied from the external connection terminal 20. The burn-in test voltage is about 25 volts relative to the source potentials of the MOS-FETs 2a and 2b. The diodes 6a and 6b prevent breakage of the circuit components of the output stage of the control IC 1. The resistors R1, R2, R3 and R4 and the control IC 1 are set such that the switching (turning on and oil) speed of the normally operating MOS-FETs 2a and 2b does not slow down extremely.

After the burn-in test, the resistors R5 and R6 formed by the thick-film method or part of the voltage supply line 5, which is an interconnection pattern, are electrically opened by, for example, a laser cut, as shown by the electrically disconnecting portions 7a and 7b, whereby the gate terminals of the MOS-FETs 2a and 2b are separated from each other.

In this embodiment, the gate terminals of the MOS-FETs 2a and 2b are respectively connected to the external connection terminal 20 through the resistors R5 and R6. However, even when they are connected directly to the external-connection terminal 20 without using the resistors R5 and R6, the effect can be obtained by electrically opening the voltage supply line after the burn-in test. Further, when more than two power MOS-FETs are provided, all of or some of them may be combined and the gate terminals thereof may be connected to each other directly or with a resistor provided therebetween.

As in the case of the first embodiment, the internal connection terminal 20a for the burn-in test 20a may be provided in place of the external connection terminal 20 for the burn-in test. In that case, the burn-in test may be performed at the intermediate stage of the manufacturing process of the hybrid integrated circuit device by applying a voltage by means of, for example, a probe pin.

Third Embodiment

Figure 3:
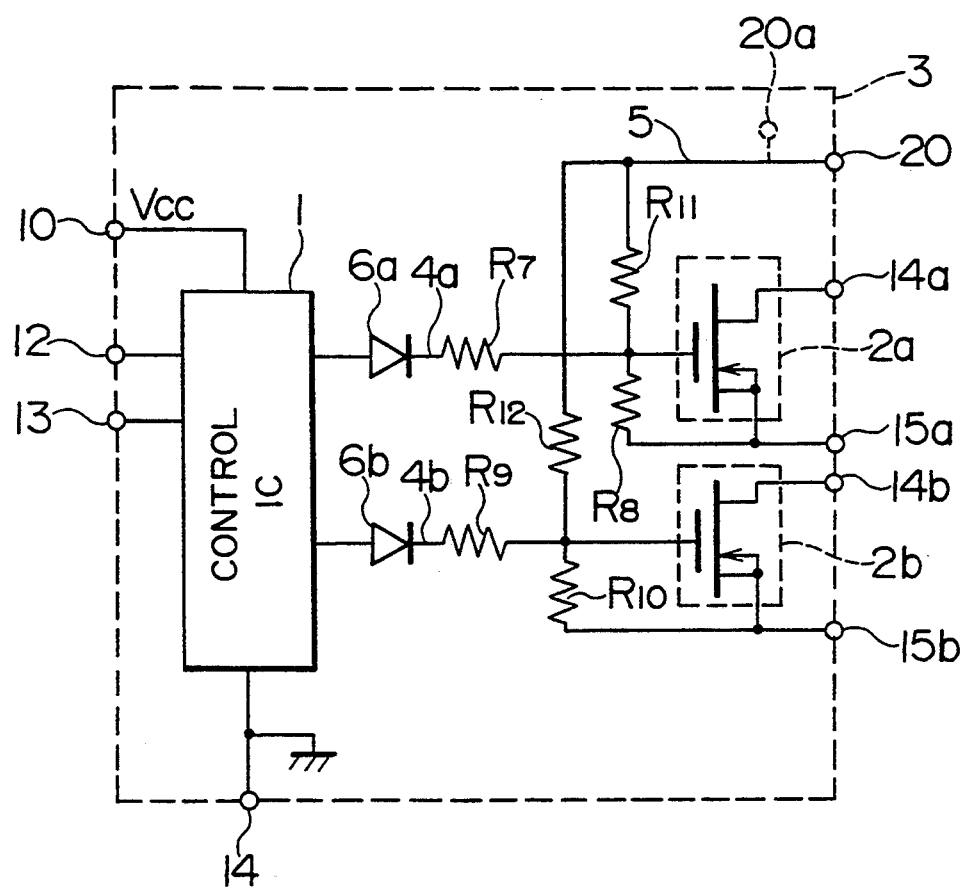
FIG. 3 is a circuit diagram schematically showing a third embodiment of the hybrid integrated circuit device according to the present invention.

FIG. 3 is a schematic view of a third embodiment of the hybrid integrated circuit device according to the present invention.. This embodiment differs from the second embodiment in that resistors R7 through R12 are provided in order to ensure normal operation after the burn-in test.

The threshold voltage between the gate and the source of each of the MOS-FETs 2a and 2b, the voltage applied between the gate and the source during normal operation and the voltage applied between the gate and the source for the burn-in test, and the values of the resistors R7, R8, R11 and R9, R10, R12 are set to adequate values which ensure that normal operations are not affected even when the connection between the resistors R11 and R12 is not cut.

As will be understood from the foregoing description, in the hybrid integrated circuit device according to one aspect of the present invention, at least a single power MOS-FET in a bare chip state and a control IC are mounted on a circuit substrate. Further, a burn-in test voltage supply line for supplying a burn-in test voltage to a gate terminal of the power MOS-FET is provided independently of the control IC. Thus, the burn-in test can be conducted effectively and simply, and the production cost can be reduced. As a result, an inexpensive and highly reliable hybrid integrated circuit device can be provided.

In the hybrid integrated circuit device according to another aspect of the present invention, a plurality of power MOS-FETs are mounted on a circuit board. Further, a burn-in test voltage supply line is connected to the gate terminal of each of the power MOS-FETs to supply a burn-in test voltage thereto independently of a control IC, and the gate terminals of the power MOS-FETs are electrically separated from each other after the burn-in test is completed. Consequently, the burn-in test can be conducted effectively, and an inexpensive and highly reliable hybrid integrated circuit device can be provided.

In the hybrid integrated circuit device according to still another aspect of the present invention, resistors each having a predetermined resistance are inserted in the burn-in test voltage supply line for supplying the burn-in test voltage to the gate terminal of each of the power MOS-FETs to prevent normal operations being affected in the circuit device according to another aspect of the present invention. Consequently, electrical separation of the gate terminals of the power MOS-FETs after the burn-in test is unnecessary. As a result, the burn-in test can be conducted effectively and efficiently, and an inexpensive and highly reliable hybrid integrated circuit device can be provided.

What is claimed is:

1. A hybrid integrated circuit device comprising:
   a plurality of power MOS-FETs in a bare chip state, each of said power MOS-FETs having a gate terminal, a drain terminal, and a source terminal;
   a control IC for supplying a control voltage to said gate terminals of each of said power MOS-FETs to control said power MOS-FETs;
   control voltage supply lines for conducting the control voltage supplied by said control IC to said gate terminals of said power MOS-FETs;
   burn-in test means connected to said gate terminals of each of said power MOS-FETs;
   a plurality of resistors having a predetermined resistance, each resistor respectively connecting said burn-in test means to a gate terminal of one of said power MOS-FETs to prevent interference of said burn-in test means with normal operation of said hybrid integrated circuit device after a burn-in test and for supplying a burn-in test voltage to said gate terminals, the resistors electrically isolating the gate terminals of each power MOS-FET from one another; and
   a circuit substrate on which said power MOS-FETs, control IC, control voltage supply line, burn-in test means, and resistors are mounted.

2. The hybrid integrated circuit device according to claim 1 wherein said burn-in test means includes burn-in test voltage supply lines, each of said voltage supply lines being connected to said gate terminal of a corresponding power MOS-FET via one of said resistors, and a connection terminal connected to each of said burn-in test voltage supply lines.

3. The hybrid integrated circuit device according to claim 1 wherein said burn-in test means includes a plurality of diodes, each of said diodes being provided in a respective control voltage supply line connecting said control IC to said gate terminal of one of said power MOS-FETs to prevent flow of current to said control IC.

* * * * *